United States Patent [19]
Hoon et al.

[11] Patent Number: 6,037,769
[45] Date of Patent: Mar. 14, 2000

[54] TORQUE MAGNETOMETRIC APPARATUS AND METHOD FOR DETERMINING THE MAGNETIC MOMENT OF A SPECIMEN

[75] Inventors: Stephen R Hoon, Glossop; Andrew N Farley, Manchester, both of United Kingdom

[73] Assignee: The Manchester Metropolitan University, United Kingdom

[21] Appl. No.: 09/248,113

[22] Filed: Feb. 11, 1999

Related U.S. Application Data

[63] Continuation of application No. PCT/GB97/02143, Aug. 11, 1997.

[30] Foreign Application Priority Data

Aug. 12, 1996 [GB] United Kingdom .................... 9616892
Dec. 27, 1996 [GB] United Kingdom .................... 9626970

[51] Int. Cl.$^7$ ......................... G01R 33/12; G01N 27/72
[52] U.S. Cl. ........................ 324/228; 324/235; 324/259; 324/261
[58] Field of Search ................................... 324/201, 228, 324/235, 244, 259–262

[56] References Cited

U.S. PATENT DOCUMENTS

| | | | |
|---|---|---|---|
| 4,037,149 | 7/1977 | Foner | 324/228 X |
| 5,001,426 | 3/1991 | Frey et al. | 324/259 |
| 5,600,241 | 2/1997 | Jacobsen | 324/228 |
| 5,739,686 | 4/1998 | Naughton et al. | 324/259 |
| 5,798,641 | 8/1998 | Spagna et al. | 324/259 X |

OTHER PUBLICATIONS

Zijlstra, H., "A Vibrating Reed Magnetometer for Microscopic Particles", Rev. Sci. Instrum. 41, 1970, pp. 1241–1243, (no month)

Rossel C et al: "Active Microlevers as Miniature Torque Magnetometers" Journal of Applied Physics, vol. 79, No. 11, Jun. 1, 1996, pp. 8166–8172.

"Low–temperature magnetic resonance force detection" WAGO et al, J. Vac. Sci. Technol. B 14 (2), Mar./Apr. 1996, p. 1197.

*Primary Examiner*—Gerard Strecker
*Attorney, Agent, or Firm*—Nixon & Vanderhye PC

[57] ABSTRACT

A method of and apparatus for torque magnetometry in which a specimen, the magnetic moment of which it is desired to determine, is disposed on a support. A temporally varying, for example sinusoidal, magnetic field is generated in the region of the specimen so that interaction between the magnetic moment of the specimen and the magnetic field causes a torque to be exerted on the specimen. Consequently, the specimen and/or the support are deflected and typically exhibit a vibratory motion. The motion of the specimen and/or support due to the torque is measured. When the magnitude and direction of the magnetic field are known, the magnetic moment of the specimen can be determined from the results of the motion measurement. The frequency of the magnetic field can be adjusted so that the specimen and/or the support resonate. The support is typically a single silicon crystal having two orthogonal modes of vibration which have different resonant frequencies. This can facilitate the independent determination of the three orthogonal components of the magnetic moment of the specimen.

17 Claims, 2 Drawing Sheets

TORQUE MAGNETOMETRIC APPARATUS AND METHOD FOR DETERMINING THE MAGNETIC MOMENT OF A SPECIMEN

This is a continuation of PCT application PCT/GB97/02143, filed 11 Aug. 1997.

BACKGROUND OF THE INVENTION

1. Field of the Invention

This invention relates to a torque magnetometer and a method of torque magnetometry. The method and magnetometer can be used for measuring extremely small magnetic moments of specimens. Such specimens may for example be ferromagnetic or superconducting specimens. The magnetic moment of a specimen may be studied as a function of temperature or applied magnetic field. Such measurements are relevant to investigations of properties of and processes in magnetic particles and nanostructures.

2. Description of the Related Art

There are a number of methods which can be used to measure a magnetic moment of a specimen. These include SQUID (super conducting quantum interference device) magnetometry, alternating gradient magnetometry and torque magnetometry.

SQUID magnetometers are currently the most sensitive commercially available magnetic moment measuring devices, with a resolution of $10^{-10}$ emu being obtainable. However, SQUID magnetometers have disadvantages. For example, it is not always feasible to make measurements of all three orthogonal components of a magnetic moment because of limitations in current fabrication technology. Further, SQUIDs can only be used in a low temperature environment and are slow to react to changing values of magnetic moment.

The sensitivity of Alternating Gradient Magnetometry is limited by a combination of factors. These include an interfering signal from the diamagnetic moment of a vibrating cantilever on which the specimen is mounted, the sensitivity of a vibration sensor which is used and microphonic noise generated in drive coils used. Microphonic noise is noise caused by the action of Lorentz forces on parts of the equipment. Alternating gradient magnetometry also has the disadvantage that it is not easily adapted to the measurement of more than one component of the magnetic moment.

The principles of torque magnetometry are briefly discussed below.

When a magnetic moment M is exposed to a uniform magnetic field B it experiences a torque T which is defined by equation (1):

$$T = M \times B \qquad (1)$$

where x represents a vector product, and the magnetic moment, magnetic field and torque are vector quantities.

The torque produced is proportional to the strength of the magnetic field and the magnitude of the magnetic moment. Therefore, if the torque can be measured and the strength of the magnetic field is known, the value of the magnetic moment can be determined. The magnetic moment m can be expressed in terms of components $m_x$, $m_y$ and $m_z$. These components being in the x, y and z directions respectively. Similarly, the torque T can be expressed in terms of components $T_x$, $T_y$ and $T_z$. When making measurements of the torque, the components of the torque can be related to the components of the magnetic moment. Therefore, it is possible to determine the magnitude of each component of the magnetic moment as well as the overall magnitude of the magnetic moment.

In conventional torque magnetometry the torque is generated by the applied magnetising field so the resolution is a function of the applied field magnitude. These magnetometers have the advantage that (isotropic) diamagnetic moments are not measured because such moments align with the applied field and therefore do not generate a torque. However, this means that such magnetometers are only sensitive to magnetic moments which have components which are orthogonal to the applied field since there are no additional magnetic fields applied. The sensitivity of conventional torque magnetometers is limited because no resonant conditions are utilized.

U.S. Pat. No. 5,600,241 discloses a vibrating-reed susceptometer in which a sample whose magnetic properties are to be studied is vibrated, typically mechanically, in the absence of a magnetic field. Once the resonant frequency is known, a dc magnetic field is applied and the effect this has is determined, typically by determining the shift in resonant frequency which occurs.

U.S. Pat. No. 5,001,426 discloses a magnetometer for measuring the magnetic moment of a specimen. This uses an inhomogeneous (spatially varying) magnetic field to exert a force on the magnetic moment of the sample. This is a gradient field magnetometer in which the force (not torque) generated on the sample is used to vibrate the sample at the resonant frequency of the support. The support is then brought to rest by generating an opposing moment using a compensating current loop also located on the sample member. This calls for the use of complicated electronic equipment and means that the device is useful only for relatively large samples—in the range of several millimeters.

U.S. Pat. No. 4,037,149 discloses a multiple mode magnetometer in which both a sample and a detecting coil are driven relative to one another. The drive is generally directly mechanical and no particular use of resonance is made. Once the relative movements are set up by non-magnetic means, an external magnetic field is applied and the resulting effect detected.

A paper by Rossel et al: "Active Microlevers as Miniature Torque Magnetometers" Journal of Applied Physics, Vol. 79, No. 11, 1 Jun. 1996, pages 8166–8173 discloses the use of a mechanically driven cantilever to determine the magnetic moment of a magnetic sample mounted on the lever. The cantilever is driven to resonance by a Bimorph and a uniform magnetic field is then applied. The shift in resonance frequency due to the generated torque is then observed. However it is stated that "the proper correlation of the frequency shift and of the damping to the actual physical parameters of the probe still remain to be clarified." It is assumed therefore that that system could not currently be used to determine a magnetic moment of a sample.

There is a need, not satisfied by the art described above, to provide a magnetic moment measurement system capable of extremely sensitive measurement of magnetic moments which can be employed over a wide temperature range, for example from 4 to 400 K and in high magnetic fields, for example up to 10T.

SUMMARY OF THE INVENTION

According to one aspect of the present invention there is provided a method for determining the magnetic moment of a specimen, which method comprises the steps of:

supporting said specimen by member support means in a locally spatially uniform magnetic field, causing the specimen and its support means to move, and measuring motion of said support means and/or said specimen to permit determination of at least one component of the magnetic moment of the specimen, characterised by:

the step of causing the specimen and its support means to move comprising the step of using the locally spatially uniform magnetic field to apply a temporally varying but locally spatially uniform magnetic drive to apply a torque to said specimen to produce a deflection of said specimen and its associated support means relative to a datum, and the further step of varying the applied field at a resonant frequency of the support, or of the support and specimen, and in that the varying torque resulting from the application of the varying magnetic field causes or allows the specimen to resonate whereby at least one component of said magnetic moment can be determined.

According to another aspect of the present invention, there is provided a torque magnetometric apparatus for determining the magnetic moment of a specimen comprising:

member support means capable of supporting a magnetic specimen, magnetic field generating means, and means for measuring motion of said support means and/or said specimen, characterised by said magnetic field generating means being arranged to generate a locally spatially uniform magnetic drive to apply a torque to said specimen to produce a deflection of said specimen and its associated support means relative to a datum, and means for varying the field applied by said generating means at a resonant frequency of the support, or of the support and specimen, and in that the varying torque resulting from the application of the varying magnetic field causes or allows the specimen to resonate whereby at least one component of said magnetic moment can be determined.

Said torque magnetometric apparatus can be for determining the magnetic moment of a specimen by the method of said one aspect of the present invention.

According to another aspect of the present invention there is provided a torque magnetometer comprising:

a member having at least one resonant frequency of vibration and being capable of supporting a specimen;

magnetic field generating means for generating at least one oscillating but at least locally spatially uniform magnetic field having a frequency substantially the same as said at least one resonant frequency; and measuring means for measuring a motion of said member;

the arrangement being such that in use, a torque is experienced by a magnetic moment of said specimen, which torque causes said member to execute said motion whereby said magnetic moment or at least one component of said magnetic moment can be determined.

Said method of torque magnetometery can further comprise the steps of:

supporting a specimen on a member having at least one resonant frequency of vibration;

generating an oscillating but at least locally spatially uniform magnetic field having a frequency substantially the same as said at least one resonant frequency; and measuring a motion of said member;

the arrangement being such that a torque is experienced by a magnetic moment of said specimen, which torque causes said member to execute said motion whereby said magnetic moment or at least one component of said magnetic moment can be determined.

A further aspect of the invention provides a resonant torque magnetometer and method of resonant torque magnetometry which are capable of measuring three orthogonal components of the magnetic moment of the specimen.

Further aspects and developments of the present invention are defined by the foregoing aspects in combination with any of or any sub-combination of the following features.

The specimen supporting means can comprise a support member.

Said supporting member may have two orthogonal transverse modes of vibration, each having a resonant frequency, in particular it is preferred that these resonant frequencies are different from one another. The specimen supporting means can comprise a cantilever and/or can comprise a single crystal of silicon. The specimen supporting means can comprise an integrated piezoelectric member, which can be a cantilever.

Any of said methods can be a method of resonant torque magnetometry. Said torque magnetometer can be a resonant torque magnetometer. Said torque magnetometric apparatus can be a resonant torque magnetometric apparatus. Any of said methods can further comprise the step of generating one or more magnetic field using magnetic field generating means.

Preferably the magnetic field generating means can generate one or more magnetic fields for exciting each or both of the modes of vibration. It is particularly preferred if the magnetic fields generated can oscillate at either or both of said resonant frequencies of said orthogonal modes.

Preferably compensating means for compensating for an effect due to a diamagnetic moment of said supporting member are provided. Any of said methods can comprise the step of compensating for an effect due to a diamagnetic moment of said supporting member.

Preferably noise reducing means for reducing microphonic noise are provided. In a particularly preferred form, the noise reducing means comprises the compensating means. Any of said methods can comprise the step of reducing microphonic noise.

Preferably the magnetic field generating means comprise at least one conductor for carrying current. Each conductor in said magnetic field generating means can comprise a planar strip. Preferably a plurality of planar strips are arranged in a planar array. Preferably at least one conductor is parallel to a longitudinal length of said member and/or at least one conductor is perpendicular to a longitudinal length of said member.

Preferably, said compensating means comprise at least one null conductor for carrying a current. One or more null conductors may be arranged parallel to one or more of said conductors.

Preferably said noise reducing means comprise at least one additional conductor which in use carries current in an opposite direction to said at least one conductor of said magnetic field generating means.

Any of said methods can include a further step of nulling the signal produced when no specimen is present to compensate for an effect due to a diamagnetic moment of said member.

Any of said methods can include a further step of minimising an effect of drift in calibration by using a dynamic feedback system.

In a particular embodiment of the invention, the deflection of the supporting member is determined under the applied field and the field is then varied to produce resonance in the support. The sample is then installed and the measurements are repeated whereby a comparison of the results permits determination of the magnetic moment of the specimen in the plane of reaction to the applied field.

BRIEF DESCRIPTION OF THE DRAWINGS

A preferred embodiment will now be described by way of example with reference to the accompanying drawings of which.

DETAILED DESCRIPTION OF THE INVENTION

Figure 1:
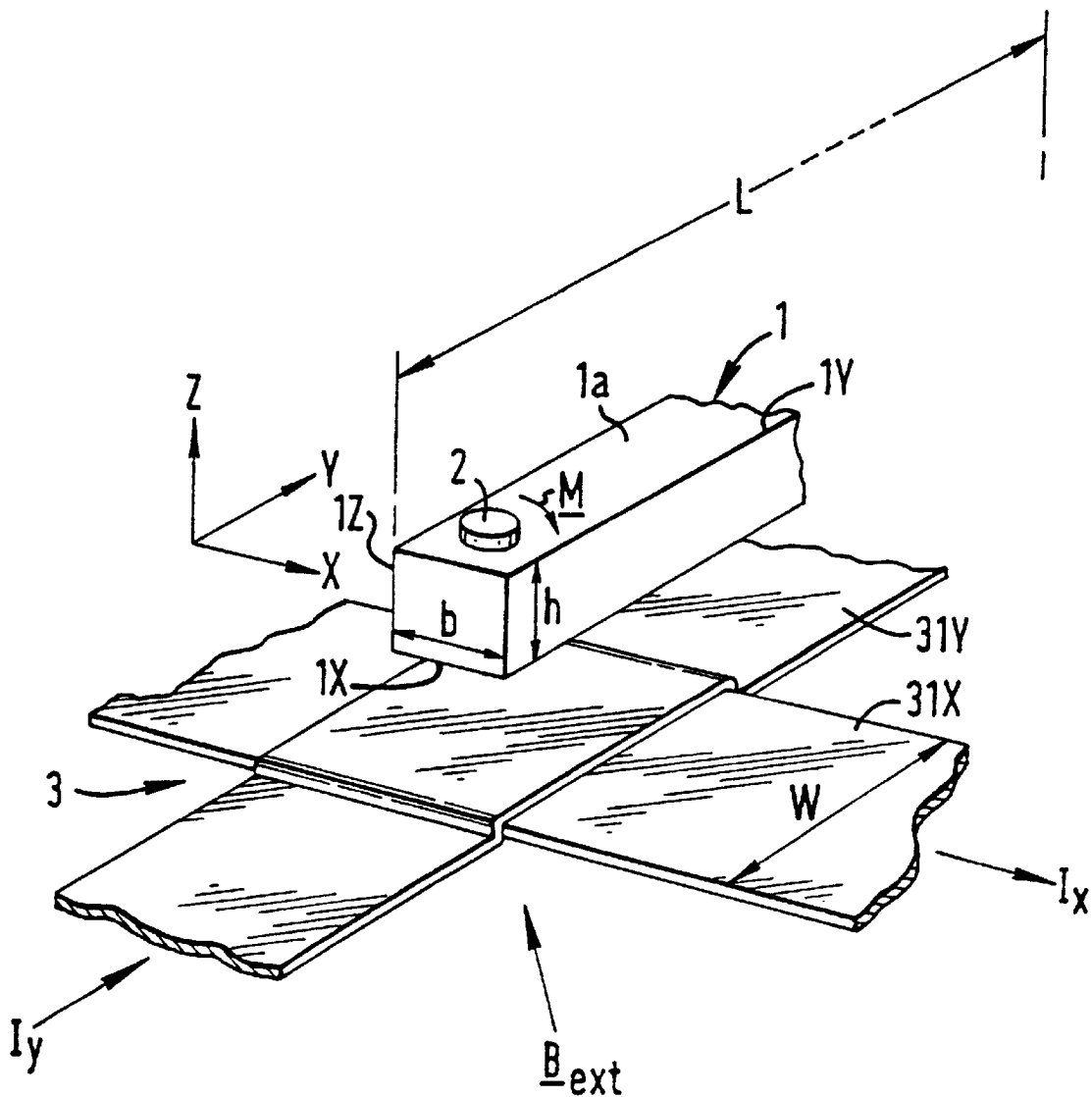
FIG. 1 is a perspective view of a torque magnetometer, showing two driving conductors but omitting trim or null conductors.
Figure 2:
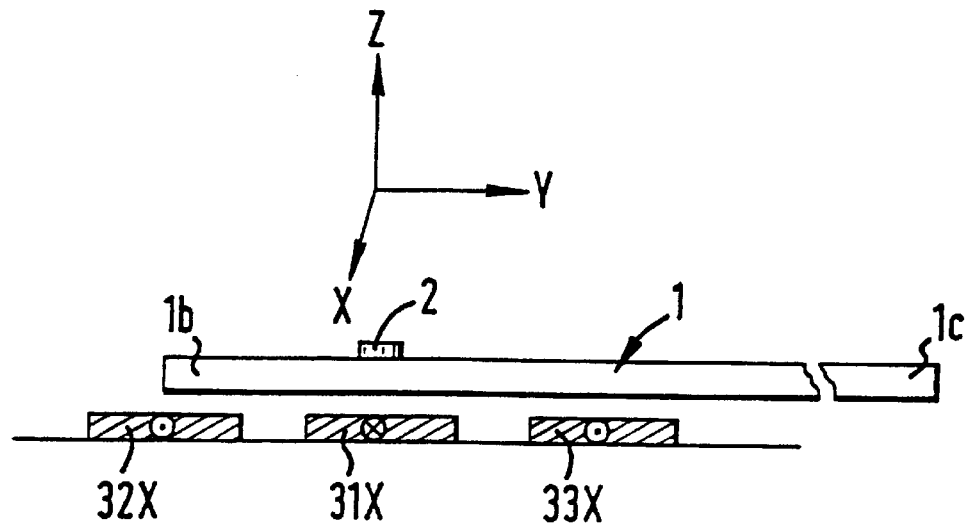
FIG. 2 is side view of the torque magnetometer shown in FIG. 1, showing transverse drive, trim and null conductors but omitting longitudinal conductors.

Referring to FIGS. 1 and 2, a torque magnetometer comprises a cantilever 1 which has a free end 1b and a clamped end 1c which is clamped against movement in all directions. The cantilever 1 is a member having two orthogonal transverse vibrational modes. Each of these modes has a different resonant frequency.

For the sake of convenience, three orthogonal directions, an X direct on, a Y direction and a Z direction are shown by arrows in the drawings. The X direction is parallel to a transverse edge of the cantilever 1X, the Y direction is parallel to the longitudinal edge of the cantilever 1Y and the Z direction is parallel to a vertical edge of the cantilever 1Z. In the X direction the cantilever has a breadth b, in the Z direction the cantilever has a height h and in the Y direction the cantilever has a length L. Typically the breadth b and the height h of the cantilever lie within the range 1 to 100 $\mu$m. However, the breadth b is greater than the height h.

The free end 1b of the cantilever 1 can move in two orthogonal directions, namely the X direction and the Z direction. One of the orthogonal modes of transverse vibration of the cantilever 1 is in the X direction and the other is in the Z direction.

The cantilever 1 is a single crystal silicon cantilever produced by micro fabrication techniques.

A magnetic specimen 2 is supported by and attached to an upper surface 1a of the cantilever 1 towards the free end 1b.

A planar array of conductors 3 for carrying current is arranged substantially in the XY plane and is displaced from the cantilever in the negative Z direction. A longitudinal driving conductor 31Y extends in the Y direction and a transverse driving conductor 31X extends in the X direction.

Referring to FIG. 2, a trim conductor 32X for carrying a trim current extends in the X direction and is parallel to and spaced in the negative Y direction from the transverse drive conductor 31X. A transverse null conductor 33X extends in the X direction and is parallel to but spaced, in the positive Y direction, from the transverse drive conductor 31X. The transverse trim conductor 32X is disposed adjacent the free end 1b of the cantilever 1 and slightly overlaps with the cantilever 1. The transverse null conductor 33X is disposed nearer to the clamped end 1c of the cantilever 1 than is the transverse drive conductor 31X. Both the transverse trim conductor 32X and the transverse null conductor 33X are in close proximity with the cantilever 1, but are relatively spaced apart from the specimen 2.

Figure 3:
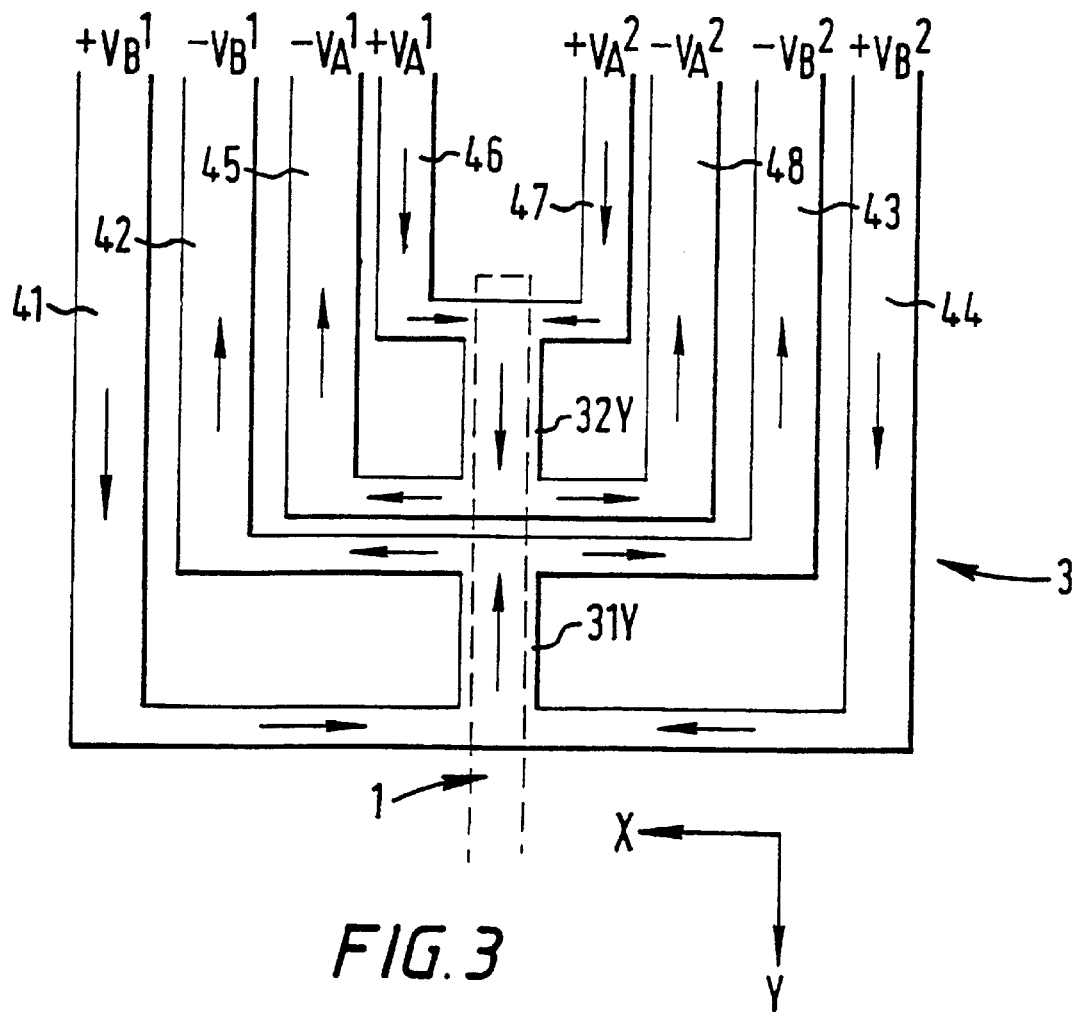
FIG. 3 is a plan view of the torque magnetometer shown in FIG. 1, showing longitudinal drive and trim conductors but omitting transverse conductors.

Referring to FIG. 3 the longitudinal drive conductor 31Y is positioned accurately along a longitudinal length of the cantilever 1 and is disposed directly under the point of the cantilever 1 where the specimen is attached. Four L shaped conductors 41, 42, 43 and 44 are connected to the longitudinal drive conductor 31Y.

A longitudinal trim conductor 32Y is disposed accurately along the longitudinal length of the cantilever 1, but is nearer the free end 1b of the cantilever 1 than is the specimen 2. The longitudinal trim conductor 32Y is therefore in close proximity with the cantilever but is spaced from the specimen 2. The longitudinal trim conductor 32Y is connected to four L-shaped conductors 45, 46, 47 and 48.

A width W of each of the drive, trim and null conductors 31, 32, 33 is typically 10 times the height h of the cantilever. Further the length L of the cantilever is typically 5 times the width W of the conductors.

All of the conductors may be fabricated onto a substrate by conventional microelectronic fabrication techniques.

The cantilever 1 and the planar array of conductors 3 can be fabricated extremely accurately so that the cantilever 1 has a precise desired positional relationship with respect to the array of conductors 3. The cantilever 1 is disposed directly above the longitudinal driving conductor 31Y and the specimen 2 is attached to the cantilever 1 in a position directly above the intersection of the transverse drive conductor 31X and the longitudinal drive conductor 31Y.

Various types of sensing techniques can be used to measure the motion of the cantilever. Such techniques include optical, capacitive or resistive measurement techniques.

When a current $I_X$ flows through the transverse driving conductor 31X a uniform magnetic field is produced in the region of the specimen 2. The uniform magnetic field causes the magnetic moment of the specimen 2 to experience torque such that the cantilever 1 is deflected. Similarly when a current $I_Y$ flows through the longitudinal conductor 31Y a uniform magnetic field is produced in the region of the magnetic specimen 2. This creates a torque on the magnetic specimen such that the cantilever is deflected. The measurement of these deflections can give a measure of the magnetic moment of the specimen when the magnitude of the applied magnetic field is known.

The direction of the deflection produced depends on the direction of the magnetic field generated and the component of the magnetic moment on which the magnetic field acts. Equation (1) can be used to find the torque T when the magnetic moment m and the magnetic field B are known. The direction of the deflection d can be found when the direction of the torque $\hat{T}$ and the direction of the length of the cantilever $\hat{L}$ are known, by using the following equation:

$$\hat{d} = \hat{T} \times \hat{L} \qquad (2)$$

where x denotes a vector product.

The direction of the deflections produced can be found by consulting the tables given below:

TABLE 1

Magnetic Field Produced by Drive Conductors.

| Current Flow (I) in Drive Conductors | Principal Component of Magnetic Field (B) Produced | Fringe Magnetic Field (B) Produced |
| --- | --- | --- |
| $I_x$ | $-B_y$ | $B_z$ |
| $I_y$ | $B_x$ | $B_z$ |

TABLE 2

Measurement of Z component of Magnetic Moment.

| Component of Magnetic Moment (m) | Component of Magnetic Field (B) | Component of Torque Produced (T) | Comment |
| --- | --- | --- | --- |
| $m_z$ | $B_y$ | $-T_x$ | Measured |
| $m_y$ | $B_x$ | $-T_z$ | Not Measured |
| $m_y$ | $B_z$ | $T_x$ | Used for Trim |
| $m_x$ | $B_y$ | $T_z$ | Not measured |

TABLE 3

Measurement of X component of Magnetic Moment.

| Component of Magnetic Moment (m) | Component of Magnetic Field (B) | Component of Torque Produced (T) | Comment |
| --- | --- | --- | --- |
| $m_x$ | $B_y$ | $T_z$ | Measured |
| $m_y$ | $B_x$ | $-T_z$ | Used for Trim |
| $m_y$ | $B_z$ | $T_x$ | Not Measured |
| $m_z$ | $B_y$ | $-T_x$ | Not measured |

TABLE 4

Measurement of Y component of Magnetic Moment.

| Component of Magnetic Moment (m) | Component of Magnetic Field (B) | Component of Torque Produced (T) | Comment |
| --- | --- | --- | --- |
| $m_y$ | $B_x$ | $-T_z$ | Measured |
| $m_x$ | $B_y$ | $T_z$ | Used for Trim |
| $m_y$ | $B_z$ | $T_x$ | Not Measured |
| $m_z$ | $B_y$ | $-T_x$ | Not measured |

TABLE 5

Direction of Deflection of Cantilever Due to Torque Experienced by Magnetic Moment.

| Component of Torque Acting on Magnetic Moment | Direction of Resulting Cantilever Deflection |
| --- | --- |
| $T_z$ | X |
| $T_x$ | $-Z$ |
| $T_y$ | None: - Only Torsion |

The following is an example of how the direction of deflection can be found when it is desired to measure a Z component of a magnetic moment. By consulting table 1 it can be seen that if a current $I_x$ flows in the positive X direction through the transverse drive conductor 31X, a principal magnetic field component $-B_y$, that is a component in the negative Y direction, will be produced in the region of the specimen 2. Table 2 shows that a magnetic field in the Y direction will interact with the Z component of the magnetic moment. When a magnetic field in the $-Y$ direction interacts with the Z component of the magnetic moment, a component of torque in the positive X direction will be produced (note the reversal of the signs). A positive X component of torque will produce a deflection in the negative Z direction as can be seen from Table 5.

The tables can be used similarly to find the following. Firstly, if a current $I_x$ is allowed to flow through the transverse drive conductor 31X then the magnetic field produced will interact with the X component of the magnetic moment and will produce a cantilever deflection in the negative X direction. When a current is allowed to flow through the longitudinal drive conductor 31Y, the magnetic field produced will interact with the Y component of the magnetic moment and produce a cantilever deflection in the negative X direction.

When the direction of current flow through the driving conductors is reversed, the directions of the deflection of the cantilever 1 are also reversed.

The cantilever 1 is free to vibrate in the X and Z directions but the breadth b in the X direction is different from the height h in the Z direction. This means that the resonant frequencies of the vibrations in the two orthogonal directions will be different. In practice, sinusoidally varying drive currents are applied to the drive conductors 31X and 31Y. These cause the cantilever to vibrate in either the X or Z direction.

When measurement of the Z component of the magnetic moment is to be made, a sinusoidally varying current $I_x$ is made to flow through the transverse drive conductor 31X, which has a frequency substantially equal to the resonant frequency of the cantilever when executing a vibration in the Z direction.

When measurement is to be made of the X component of the magnetic moment, a sinusoidally varying current $I_x$ is made to flow through the drive conductor 31X, which has a frequency substantially equal to the resonant frequency of the cantilever when vibrating in the X direction.

When the Y component of the magnetic moment is to be measured, a sinusoidally varying current $I_y$ is made to flow in the longitudinal drive conductor 31Y which has a frequency substantially the same as the resonant frequency of the cantilever and vibrating in the X direction.

Thus, it can be seen that it is possible to measure all three of the components of the magnetic moment independently from one another. The sensitivity of the device is greatly increased because the frequency of the applied field is matched to the mode of vibration of the cantilever in the appropriate direction. This reduces the effect of noise due to magnetic moments which are not of interest and of extraneous magnetic fields. Further, when for example, the Z component of the magnetic moment is being measured the frequency of the driving magnetic field is tuned to the resonant frequency of the vibration of the cantilever in the Z direction. This means that the amplitude of oscillation of the cantilever in the Z direction will be far greater than in the X direction, even though the applied magnetic field will be also acting on the X component of the magnetic moment.

The quality or Q factor of the cantilever is extremely high. The Q factor is defined to be proportional to $2\pi$ times the ratio of the energy stored in each cycle of the vibration to the energy dissipated during each cycle of the vibration. A system with a high Q factor is one which has a very sharp resonance and experiences low damping. In effect this means that when the cantilever is oscillating near to resonance, the amplitude of the oscillations are far greater than when the cantilever is oscillating at a frequency which is significantly different from the resonant frequency. A single crystal silicon cantilever operating in a high vacuum environment can have a Q factor as high as 100,000.

At the nth resonant mode the peak deflection of the cantilever may be described by $$d_c(f) = \frac{\alpha_n TQ}{K_c L_c}$$

Where dc(f) is the peak cantilever deflection at resonant frequency f, $\alpha_n$ is a constant of proportionality dependent upon the nth resonant mode, T is the peak torque on the cantilever and Q, Kc and Lc are the cantilever Q factor, elastic spring constant and length respectively. The magnetic moment may then be determined from dc(f) and the peak (a.c.) magnetic field (emanating from the current carrying strip).

To allow measurement of all three components of the magnetic moment of the specimen 2, it is important that the resonant frequencies of the orthogonal modes of vibration of the cantilever are well separated.

It is possible to study the behaviour of the magnetic moment of the specimen under an externally applied magnetic field. An additional external magnetic field $B_{ext}$ is applied and the magnetic moment can be measured as a function of the magnitude and direction of the applied field.

The behaviour of the magnetic moment can also be studied as a function of temperature.

The sensitivity of any magnetometer is affected by the interactions between the applied magnetic field(s) and the diamagnetic moment of the cantilever or any specimen support which is provided.

In the preferred embodiment, the effect of the diamagnetic moment of the cantilever 1 is minimised because the oscillating magnetic fields which drive the cantilever are generated by the drive conductors 31X and 31Y which are planar strips which are small on the scale of the cantilever 1 although they are larger than the specimen 2. The specimen 2 is in close proximity with the drive conductors 31X and 31Y so it is affected by the locally uniform field, but this field decays rapidly along the length of the cantilever 1 thereby minimising the amount of the cantilever 1 which is exposed to a drive field. The contribution of the diamagnetic moment of the cantilever is therefore minimised.

The sensitivity of the magnetometer is further improved by the provision of compensating means for compensating for an effect due to a diamagnetic moment of a cantilever 1 or any specimen support which is provided (not shown). The compensating means comprises the transverse trim conductor 32X, the transverse null conductor 33X and the longitudinal trim conductor 32Y.

In use when there is a current flowing through the transverse drive conductor 31X, the transverse trim conductor 32X and the transverse null conductor 33X are provided with sinusoidally varying currents which are at all times anti-parallel to the current in the drive conductor 31X. The directions of the current through the drive, trim and null conductors 31X, 32X and 33X, at a certain time, are shown by the conventional cross and dot symbols in FIG. 2. Because the trim and null conductors 32X and 32Y are close to the cantilever 1 but spaced from the specimen 2, the field produced by the trim and null conductors 32X and 33X have an effect on the cantilever, but are almost zero at the specimen.

The currents flowing in the transverse trim conductor 32X and the transverse null conductor 33X can be varied. To remove the effects due to the diamagnetism of the cantilever, the signal from the measurement system of the motion of cantilever is nulled when the magnetometer is operated and there is no specimen present. This nulling operation compensates for the interaction between the Z and X components of the diamagnetic moment of the cantilever and the applied uniform magnetic field in the Y direction and the interaction between the Y component of the diamagnetic moment of the cantilever with the fringe field component of the magnetic field in the Z direction.

No means are provided for compensating for the interaction between the Y component of the diamagnetic moment of the cantilever and the X component of the fringe field of the applied magnetic field because this component of the magnetic field should be very close to zero when the cantilever is accurately aligned along the Y axis.

When the Y component of the magnetic moment of the specimen is being measured, a drive current is applied to the longitudinal drive conductor 31Y. Again, the diamagnetic moment of the cantilever 1 can have an effect on the torque produced. To compensate for this a current is made to flow in the longitudinal trim conductor 32Y which is also sinusoidally varying, but is at all times in anti-parallel to the current in the longitudinal drive conductor 31Y.

The direction of conventional current flow, at a certain time, in the longitudinal drive conductor 31Y, the longitudinal trim conductor 32Y and the L-shaped conductors 41 to 48 are shown by arrows in FIG. 3. The voltages applied at this time to the remote ends of each of the L-shaped conductors 41–48 are also shown.

Because the longitudinal trim conductor 32Y is in close proximity with the cantilever but is spaced from the specimen 2, the field generated by a current flowing in the longitudinal trim conductor 32Y is experienced by the cantilever, but not by the specimen 2.

The magnitude of the current in the longitudinal trim conductor 32Y is adjusted, while the magnetometer is being operated but there is no specimen 2 present, so that the signal given out by the measurement system of the movement of the cantilever is nulled. This effectively compensates for the diamagnetic contribution from the cantilever 1.

The sensitivity of the magnetometer is further improved because microphonic noise is reduced. The microphonic noise occurs due to Lorentz forces acting on various conductors. These Lorentz forces occur due to the mutual interaction of the conductors or an externally applied magnetic field. In the preferred embodiment, the magnetic drive field is generated by the drive conductors 31X and 31Y and the cantilever 1 is positioned immediately above the conductors 31X and 31Y in a well defined position. The specimen 2 is placed on the cantilever 1 at a position in close proximity to the drive conductors 31Y and 31X. This means that the total current required to achieve a given magnetic drive field magnitude is minimised. In turn this minimises the Lorentz forces acting on the drive conductors 31X and 31Y and therefore microphonic noise is minimised. However, microphonic noise is further reduced by siting additional conductors, which carry currents flowing in the opposite direction to the drive currents, adjacent the drive conductors 31X, 31Y. The transverse trim conductor 32X, the transverse conductor 33X and the longitudinal 32Y are such additional conductors. The currents flowing through these conductors serve to reduce the microphonic noise as well as being used to compensate for the diamagnetic moment present in the cantilever 1.

A dynamic feedback control system can be used to minimise drift in the calibration of the system due to temperature and other environmental fluctuations leading to changes in Q and Kc. The magnitude of deflection of the cantilever is electronically fed back to an actuator, typically a capacitor plate, which generates an electrostatic force acting on the cantilever. This electro-mechanical feedback can be employed to modify the dynamical properties of the cantilever. The effective quality factor, resonant frequency and spring constant of the cantilever can be adjusted and stabilised by a suitable design of the feedback loop thus eliminating drift due to temperature or other fluctuations.

In an alternative method, the effect of the diamagnetic moment of the cantilever 1 can be compensated for in the following manner. The trim and null conductors 32X, 32Y and 33X are used in a similar way to that described above. However, rather than nulling the signal from the cantilever measurement system before a specimen 2 is placed on the cantilever 1, the overall signal when the specimen 2 is in place is minimised. This minimisation is achieved by varying the currents in the trim and null conductors 32X, 32Y and 33X. The total signal will be minimised when the effect due to the diamagnetic moment of the cantilever 1 has been compensated for.

Because of the accuracy of the nano-lithographic fabrication techniques used to produce the cantilever 1 and associated support structure (not shown), it is possible to produce a number of reference cantilevers (not shown) so that different nulling techniques can be employed. With such an arrangement it will be possible to measure the motion due to diamagnetic moment of one of the reference cantilevers and the motion of cantilever 1 when specimen 2 is attached. The signal from the reference cantilever can then be subtracted from the signal of the cantilever 1 to compensate for the effect of the diamagnetic moment of the cantilever.

The use of resistors or capacitive (deflection) sensors integrated onto the cantilever by conventional silicon microfabrication or related techniques can allow the production of a stable and compact arrangement which is suited to installation in the confined space of a low temperature or vacuum system.

At liquid helium temperatures, the magnetic moment of a specimen can be triaxially determined to a resolution of $10^{-15}$ emu.

What is claimed is:

1. A method for determining the magnetic moment of a specimen, which method comprises the steps of:

supporting said specimen with a support member, causing the specimen and said support member to move using a temporally varying but locally spatially uniform magnetic field that applies a varying torque to said specimen to produce a deflection of said specimen and said support member relative to a datum, said magnetic field being varied at one of a resonant frequency of the support member and a resonant frequency of the support member and specimen, and measuring motion of at least one of said support member and said specimen to permit determination of at least one component of the magnetic moment of the specimen, wherein the varying torque resulting from the application of the varying magnetic field causes the specimen and the support member to resonate whereby said at least one component of said magnetic moment can be determined.

2. A method according to claim 1 wherein said step of supporting comprises supporting said specimen on a support member having at least one resonant frequency of vibration;

said step of causing comprises generating an oscillating but at least locally spatially uniform magnetic field having a frequency substantially the same as said at least one resonant frequency; and said step of measuring comprises measuring a motion of said support member;

the arrangement being such that a torque is experienced by a magnetic moment of said specimen, which torque causes said support member to execute said motion whereby said at least one component of said magnetic moment can be determined.

3. A method according to claim 1 wherein the support member is a cantilever.

4. A method according to claim 1 including the further step of measuring three orthogonal components of the magnetic moment of the specimen.

5. A method according to claim 1 wherein said support member has two orthogonal transverse modes of vibration each having a resonant frequency, the resonant frequencies of the two orthogonal modes being different from one another.

6. A method according to claim 5 including the step of providing magnetic field generating means which are arranged to be adjustable to generate magnetic fields which oscillate at either or both at said resonant frequencies of said orthogonal modes.

7. A method according to claim 1 including the step of providing compensating means for compensating for an effect due to a diamagnetic moment at said supporting support member.

8. A method according to claim 1 including the step of providing means for reducing microphonic noise.

9. A method according to claim 1 comprising, before said supporting step, the further steps of:

determining a deflection of the support member, without the specimen in place, in said magnetic field;

varying the magnetic field to produce resonance in the support member; and after the steps of determining the deflection and varying the field without the specimen in place, installing the specimen and repeating the measurements whereby a comparison of the results permits determination of the magnetic moment of the specimen in a plane of reaction to the applied magnetic field.

10. A torque magnetometric apparatus for determining the magnetic moment of a specimen comprising:

a support member capable of supporting a magnetic specimen, magnetic field generating means arranged to generate a locally spatially uniform magnetic field to apply a torque to said specimen to produce a deflection of said specimen and said support member relative to a datum, means for measuring motion of at least one of said support member and said specimen, and means for varying the field applied by said generating means at one of a resonant frequency of the support member and a resonant frequency of the support member and specimen, wherein the varying torque resulting from the application of the varying magnetic field causes the specimen and support member to resonate whereby at least one component of said magnetic moment can be determined.

11. Apparatus according to claim 10 wherein the support member has at least one resonant frequency of vibration;

the magnetic field generating means are arranged for generating an oscillating but at least locally spatially uniform magnetic field having a frequency substantially the same as said at least one resonant frequency; and the arrangement is such that a torque is experienced by a magnetic moment of said specimen, which torque causes said support member to execute said motion whereby said at least one component of said magnetic moment can be determined.

12. Apparatus according to claim 10 wherein the support member is a cantilever.

13. Apparatus according to claim 10 which is arranged for measuring three orthogonal components of the magnetic moment of the specimen.

14. Apparatus according to claim 10 wherein said support member has two orthogonal transverse modes of vibration each having a resonant frequency, the resonant frequencies of the two orthogonal modes being different from one another.

15. Apparatus according to claim 14 wherein the magnetic field generating means are arranged to be adjustable to generate magnetic fields which oscillate at either or both of said resonant frequencies of said orthogonal modes.

16. Apparatus according to claim 10 including compensating means for compensating for an effect due to a diamagnetic moment of said support member.

17. Apparatus according to claim 10 including means for reducing microphonic noise.

* * * * *